(12) United States Patent  
Park et al.

(10) Patent No.: US 8,909,412 B2  
(45) Date of Patent: Dec. 9, 2014

(54) APPARATUS AND METHOD FOR PROCESSING SENSOR DATA FOR VEHICLE USING EXTENSIBLE MARKUP LANGUAGE

(75) Inventors: Sang Hyun Park, Yongin-si (KR); Soo Young Min, Suwon-si (KR); Chul Dong Lee, Seongnam-si (KR); Jae Jin Ko, Gwangju-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 956 days.

(21) Appl. No.: 12/978,462

(22) Filed: Dec. 24, 2010

(65) Prior Publication Data

US 2011/0161804 A1 Jun. 30, 2011

(30) Foreign Application Priority Data

Dec. 28, 2009 (KR) ........................ 10-2009-0132183

(51) Int. Cl.
*G06F 17/00* (2006.01)
*H04L 29/08* (2006.01)
*H03M 7/30* (2006.01)

(52) U.S. Cl.
CPC ............. *H03M 7/707* (2013.01); *H04L 67/12* (2013.01)
USPC ........................................ 701/29.7; 715/239

(58) Field of Classification Search
USPC ................... 701/29.7, 32.7, 29.8, 30.8, 30.9; 700/96, 117, 201; 340/3.1, 511; 715/239; 361/679.27, 679.08
See application file for complete search history.

(56) References Cited

U.S. PATENT DOCUMENTS

| 6,505,086 B1 * | 1/2003 | Dodd et al. ..................... 700/65 |
| 7,891,004 B1 * | 2/2011 | Gelvin et al. .................. 726/26 |
| 2008/0284575 A1 | 11/2008 | Breed |
| 2009/0150017 A1 | 6/2009 | Caminiti |

* cited by examiner

*Primary Examiner* — Marthe Marc-Coleman
(74) *Attorney, Agent, or Firm* — Sughrue Mion, PLLC

(57) ABSTRACT

An apparatus and a method for processing sensor data for a vehicle using an unified data format eXtensible Markup Language in process of data communication between various vehicle sensors and a vehicle application system, which facilitates transmit and receive data processing in terms of a vehicle network of the sensors and the application system are provided. The apparatus for processing the sensor data for the vehicle using the XML includes a plurality of vehicle sensors installed inside the vehicle for detecting a change of physical quantity and providing a detection signal; a sensor transducer for converting the detection signal of the vehicle sensors to an electrical analog signal; a signal conditioning unit for amplifying the electrical analog signal to a measurable signal; an Analog/Digital Converter (ADC) for converting the amplified analog signal to sensor data of a digital signal; a frame generator for generating and providing the sensor data converted to the digital signal per frame; and a sensor data converter comprising a Dynamic data Exchange Channel (DEC) for batch-processing the sensor data input from the frame generator per frame, in an XML format. The DEC of the sensor data converter defines a structure of the sensor data using a schema of the XML and converts the sensor data format to the XML format at the same time.

11 Claims, 10 Drawing Sheets

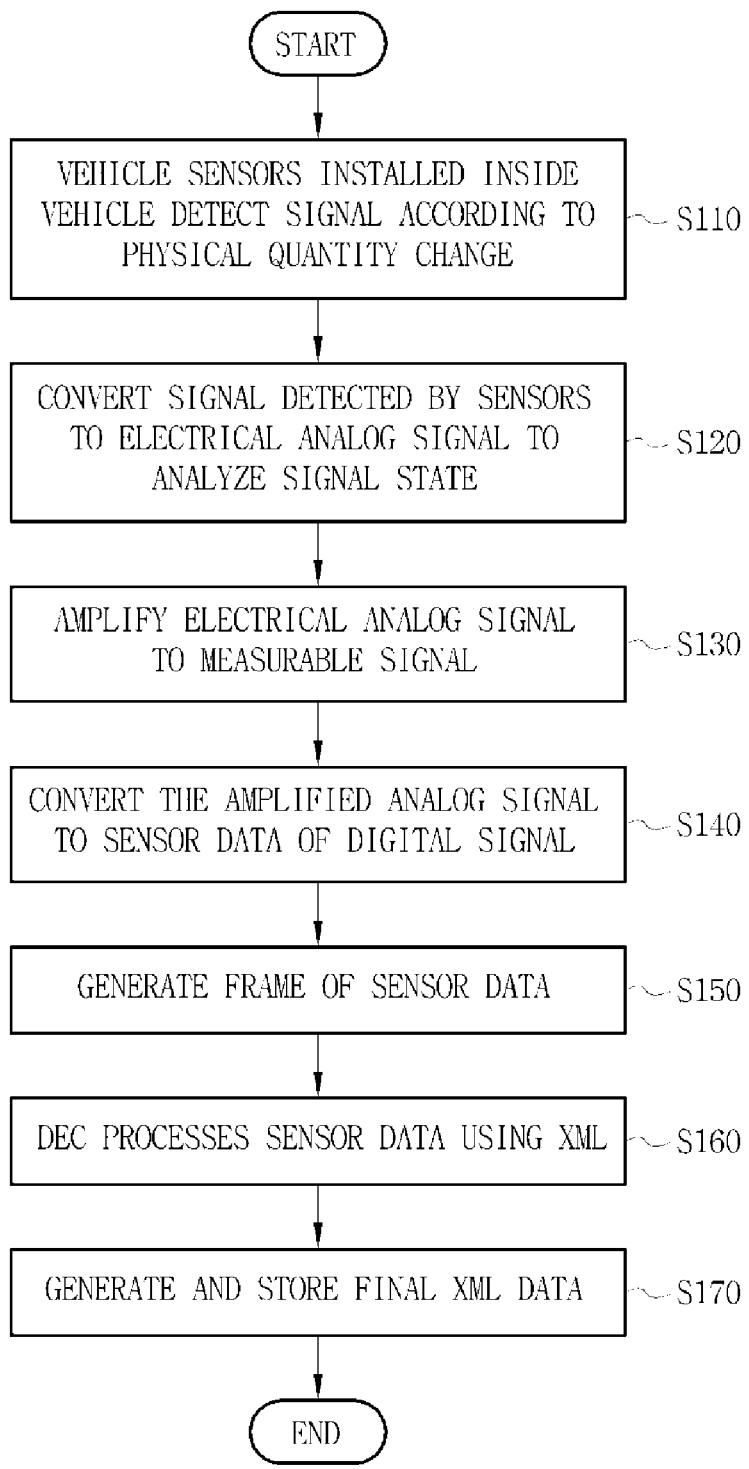

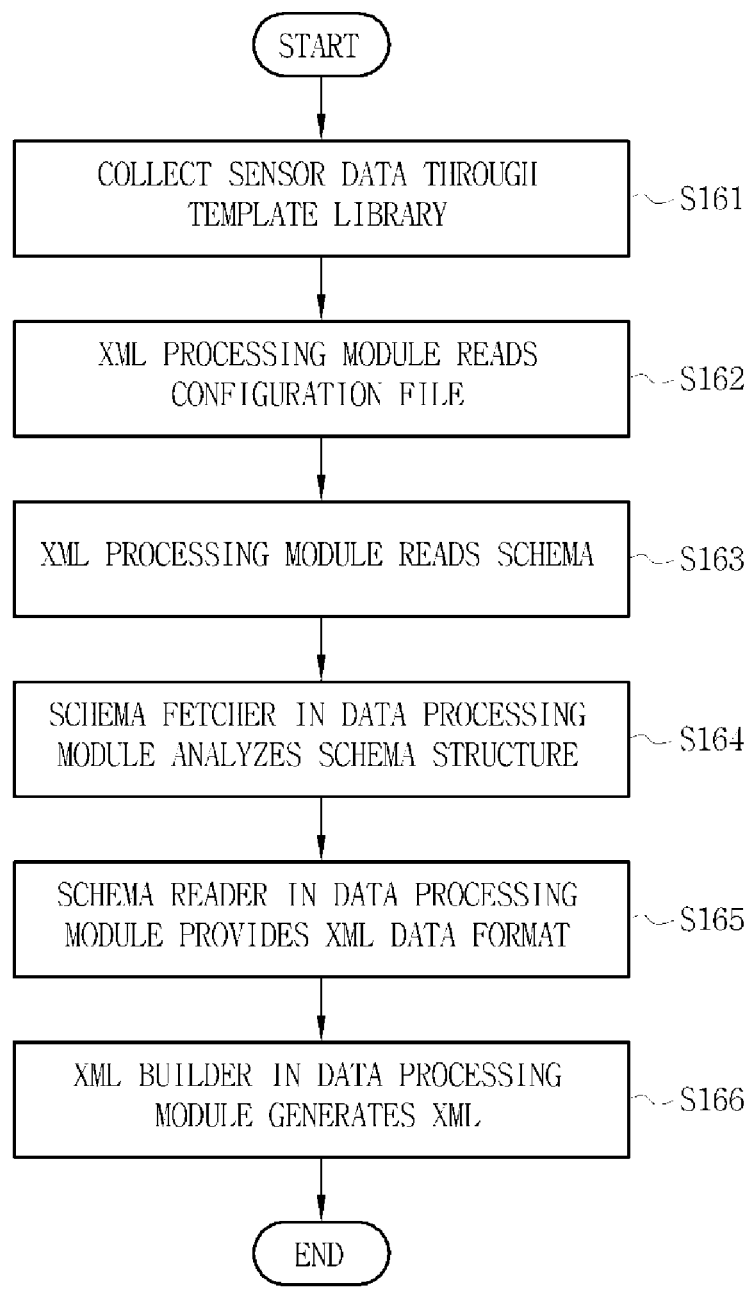

APPARATUS AND METHOD FOR PROCESSING SENSOR DATA FOR VEHICLE USING EXTENSIBLE MARKUP LANGUAGE

TECHNICAL FIELD OF THE INVENTION

The present invention relates generally to a sensor data processing for a vehicle. More particularly, the present invention relates to an apparatus and a method for batch-processing sensor data detected from sensors in a vehicle using eXtensible Markup Language (XML).

CROSS-REFERENCE TO RELATED APPLICATION

This application claims priority to Korean Patent Application having serial number 10-2009-0132183, filed on Dec. 28, 2009, which is incorporated by reference in its entirety.

BACKGROUND OF THE INVENTION

Present-day vehicles not only function as a transportation means but also provide various information to a driver during the running in conjunction with various electrical and electronics technologies. Recently, remarkable progress of Intelligent Transport Systems (ITS) industry enables to easily receive traffic information via not only the radio and the TV but also a mobile phone, a radio pager, a portable computer, and an on-board telematics system, which changes our daily life.

As such, diverse driving assistance devices for various services are installed in the vehicle. To carry out the given functions, the driving assistance devices should detect a change of an external physical quantity and make an appropriate determination. For example, an airbag system should detect a change of the impact exerted to the vehicle. When the detected impact exceeds a preset threshold, the airbag system can determine the dangerous impact level and protect the driver by activating the airbag.

Naturally, all of the assistance devices commonly include a vehicle sensor to detect the change of the physical quantity. The sensors widely used nowadays include an inertial sensor such as accelerometer and Gyroscope.

FIG. 1 illustrates a conventional sensor data processing apparatus for the vehicle, and FIG. 2 illustrates a conventional signal processing method of a pressure sensor for the vehicle.

The conventional vehicle sensor data processing apparatus 10 of FIG. 1 can include, for example, a temperature compensation optical sensor 11, an amplifier 12, a noise rejection filter 13, an Analog/Digital Converter (ADC) 14, and an I2C interface 15.

The conventional vehicle sensor data processing apparatus 10 adopts a simplified digital control system controlled via the temperature compensation optical sensor 11, the ADC 14, and the I2C interface 15.

In the conventional vehicle pressure sensor signal processing method of FIG. 2, normally, the signal processing of a pressure sensor 27 connects three lines 23 including power, signal and ground, to an Electronic Control Unit (ECU) 21. Herein, the reference number 22 indicates a pull-up or pull-down resistor of the ECU 21, the reference number 24 indicate a pressure chamber, the reference number 25 indicates a nozzle, the reference number 26 indicates a PCB, and the reference number 28 indicates an IC for the signal conversion.

Meanwhile, Korean Patent Registration No. 10-520465 entitled 'INTEGRATED SENSOR SYSTEM FOR VEHICLES' filed on Nov. 20, 2002 describes a system which unifies several sensors used in the driving assistance devices in the vehicle, into a single integrated sensor, which is explained by referring to FIGS. 3A and 3B.

FIG. 3A illustrates the conventional integrated sensor system for the vehicles, and FIG. 3B illustrates a location of the integrated vehicle sensor system inside the vehicle.

Referring to FIG. 3A, the conventional integrated sensor system 30 for the vehicles includes a sensor means 31, a data conversion means 32, a processor 33, and a communication means 34.

The sensor means 31 measures a first physical quantity as the most basic physical quantity. The sensor as the measurement means can employ an accelerometer or a Gyroscope. According to the type of the physical quantity to measure, the accelerator accelerometer or the Gyroscope can be used alone or in combination. The measured data is generally in the analog format.

The data conversion means 32 converts the first physical quantity input from the sensor means 31, to data in the format processable by the processor 33. For example, the data conversion means 32 converts the first physical quantity measured in the analog format, into the digital data format.

The processor 33 generates second physical quantity data by processing the digital data converted through the data conversion means 32. For example, the second physical quantity can include a location, an acceleration, an angle, an impact quantity, or a posture.

The communication means 34 sends the second physical quantity data generated by the processor 33 to the driving assistance devices in the vehicle. Hence, the driving assistance devices can receive their necessary physical quantity data via the communication means 34 in the vehicle, determine the physical state of the vehicle based on the received information, and perform a necessary function. The communication means 34 can adopt various data bus standards developed and applied as the on-board LAN. For example, Media Oriented System Transport (MOST), IDB-CAN, and IDB-1394 can be applied to the communication means 34.

FIG. 3B depicts the location of the integrated vehicle sensor system inside the vehicle. The integrated sensor system for the vehicle is in the center of the vehicle 40.

This conventional integrated sensor system for the vehicles unifies the sensors which are scattered over the several driving assistance devices in the vehicle to perform the same function, thus preventing the redundancy of the sensors and drastically reducing the number of the sensors.

Korean Patent Registration No. 10-708385 entitled 'SMART MODULE FOR IN-VEHICLE SENSOR NETWORK' filed on Mar. 27, 2006 is explained by referring to FIG. 4.

FIG. 4 illustrates the conventional in-vehicle sensor network smart module.

Referring to FIG. 4, the in-vehicle sensor network can be configured by connecting an in-vehicle network 50, an in-vehicle sensor network 90, a multimedia terminal 70, and a control means 80 through the in-vehicle sensor network smart module 60.

The in-vehicle network 50, which is a network deployed in a commercial in-vehicle product, is a system for controlling and connecting electronic parts, an ECU, a sensor, and an actuator over the network. The in-vehicle network 50 can be, for example, Control Area Network (CAN), Local Interconnect Network (LIN), J1850, MOST, FlexRay, Time Triggered CAN (TTCAN), and Time Triggered Protocol/Class C (TTP/C).

The sensor network 90 includes sensors 92, and sensor clustering nodes 91 for receiving sensing data generated from the sensors 92 and forwarding the sensing data to the in-vehicle sensor network smart module 60.

The sensor 92 is installed inside the vehicle to detect the status data of the vehicle and data relating to the driving state.

The sensor clustering node 91 includes a sensing data reception module 91a for receiving the sensing data from the sensors 92 newly installed in the in-vehicle network, and a sensing data transmission module 91b for sending the received sensing data to a gateway.

The in-vehicle sensor network smart module 60 filters and receives the sensing data generated from the sensors installed in the vehicle, and the sensing data in the in-vehicle network 50 over which control signals for controlling the components of the vehicle are sent and received. The in-vehicle sensor network smart module 60 can include a data collection module 61 which filters and receives the sensing data from the in-vehicle network and receives and aggregates the sensing data from the sensor network added to the vehicle, a data management module 62 which converts the aggregated sensing data to a format to be output from the multimedia terminal 70 or the control means 80, and a data transmission module 63 which, when a control signal of the sensing data request is input from the multimedia terminal 70 or the control means 80 added to the vehicle, sends the sensing data converted or processed according to the control signal to the multimedia terminal 70 or the control means 80.

The conventional in-vehicle sensor network smart module can be applied regardless of the protocol used in the vehicle network system, and operate various expanded devices using the sensing data with flexible compatibility.

On the one hand, according to the recent electronic vehicles, a great number of sensors is installed in the vehicle and various communication protocols including CAN, FlexRay, and MOST are used.

However, about 40 sensors are used in a midsize vehicle available, about 20 sensors are used in a compact vehicle, and more than 80 sensors are used in a luxury car. Accordingly, it is difficult to efficiently manage the increasing vehicle sensor data with the conventional methods.

Moreover, information sent from diverse vehicle sensors is exchanged as the physical analog signal among the electronic parts, which is inapplicable to an application system such as telematics or portable multimedia device. That is, various data is exchanged during the communication between the diverse vehicle sensors and the vehicle application system in different formats and manners. In addition, as the number of the vehicle sensor increases, it is harder to transmit and manage the data.

SUMMARY OF THE INVENTION

To address the above-discussed deficiencies of the prior art, it is a primary aspect of the present invention to provide an apparatus and a method for processing sensor data for a vehicle using an unified data format XML, which facilitates transmit and receive data processing in terms of a vehicle network of sensors and an application system and allows easy data structure to developers of vehicle sensors and a terminal system.

Another aspect of the present invention is to provide an apparatus and a method for processing sensor data for a vehicle using an XML, which modifies merely schema data by defining a data structure using schema, which is one of XML features, without having to modify a program code when a data format is added/deleted/modified, and thus allows to easily change the data format between a vehicle sensor and a vehicle application system.

According to one aspect of the present invention, an apparatus for processing sensor data for a vehicle using an eXtensible Markup Language (XML) includes a plurality of vehicle sensors installed inside the vehicle for detecting a change of physical quantity and providing a detection signal; a sensor transducer for converting the detection signal of the vehicle sensors to an electrical analog signal; a signal conditioning unit for amplifying the electrical analog signal to a measurable signal; an Analog/Digital Converter (ADC) for converting the amplified analog signal to sensor data of a digital signal; a frame generator for generating and providing the sensor data converted to the digital signal per frame; and a sensor data converter comprising a Dynamic data Exchange Channel (DEC) for batch-processing the sensor data input from the frame generator per frame, in an XML format. The DEC of the sensor data converter may define a structure of the sensor data using a schema of the XML and convert the sensor data format to the XML format at the same time.

The DEC may include an XML processing module for analyzing and generating basic XML; a data processing module for assembling the sensor data in the XML format or analyzing the XML data, and verifying a format according to the schema; and a template library for providing various useful functions required to transmit, process, and store the sensor data.

The data processing module may include a configurator for configuring location and type of the sensor and the schema; a schema fetcher for analyzing a schema file defined by a configuration file and having corresponding contents; a schema reader for aggregating schemas, defining a data format, and providing the XML data format; and an XML builder for receiving the XML data format from the schema reader and generating the aggregated sensor data in the XML data format according to the defined schema.

The data processing module may further include an XML reader for analyzing and constituting existing XML data in a tree structure, and modifying, searching, and extracting intended information if necessary.

The XML processing module may provide an Application Programming Interface (API) required to analyze and to generate the XML by providing an XML processing function based on Document Object Model (DOM).

The template library may include a thread for providing a multithread function to collect a plurality of sensor data at the same time; a synchronization processor for synchronizing the sensor data; a socket for establishing a communication channel required to collect the sensor data; and a data container for containing the collected data.

The sensor data converter may include a 32-bit CPU for processing 32-bit sensor data provided from the frame generator.

According to another aspect of the present invention, a method for processing sensor data for a vehicle using an XML includes a) detecting, at a plurality of vehicle sensors installed inside the vehicle, a signal according to a change of physical quantity; b) converting the signal to an electrical analog signal to analyze state of the signals detected by the vehicle sensors; c) amplifying the electrical analog signal to a measurable signal; d) converting the amplified analog signal to sensor data of a digital signal; e) generating frames of the sensor data of the digital signal and providing the sensor data per frame; and f) converting, at a Dynamic data Exchange Channel (DEC), the sensor data provided per frame, to an XML-format data. The DEC may define a structure of the sensor data using a schema of the XML and convert the sensor data format to the XML format at the same time.

The method may further include storing or outputting the converted XML-format sensor data.

The DEC of the step f) may include an XML processing module, a data processing module, and a template library, and the step f) may include f-1) collecting the sensor data through the template library; f-2) acquiring, at the XML processing module, type and location of the sensors and the schema by reading a configuration file; f-3) reading, at the XML processing module, the schema defining the data format; f-4) acquiring, at a schema fetcher of the data processing module, the schema structure by analyzing the schema; f-5) aggregating, at a schema reader of the data processing module, schemas, defining the data format, and providing the XML data format; and f-6) generating, at an XML builder of the data processing module, XML data corresponding to the sensor data according to the XML data format.

The method may further include analyzing and constituting existing XML data in a tree structure, and modifying, searching, and extracting intended information if necessary.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 10 is a flowchart of a vehicle sensor data processing method using the XML according to an exemplary embodiment of the present invention; and FIG. 11 is a detailed flowchart of the DEC in the vehicle sensor data processing method using the XML according to an exemplary embodiment of the present invention.

Throughout the drawings, like reference numerals will be understood to refer to like parts, components and structures.

DETAILED DESCRIPTION OF THE INVENTION

Figure 1:
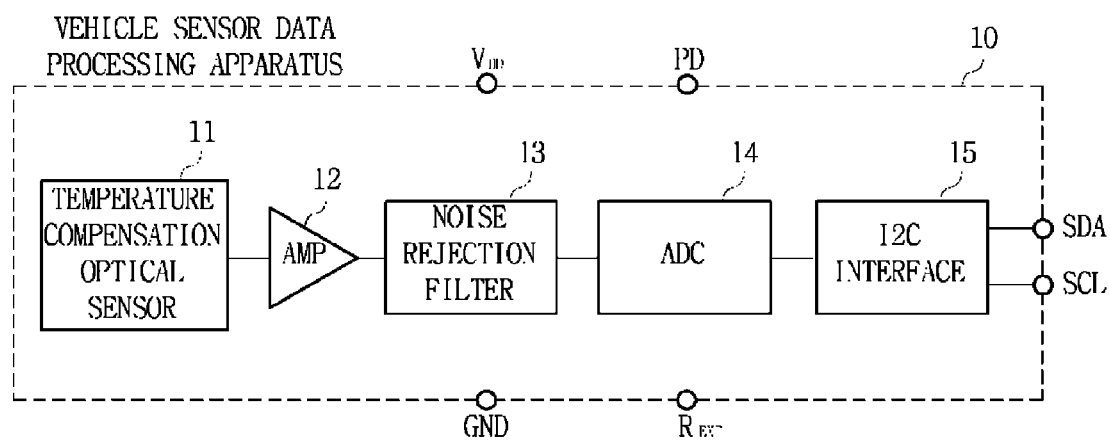
FIG. 1 is a block diagram of a conventional sensor data processing apparatus for vehicles.
Figure 2:
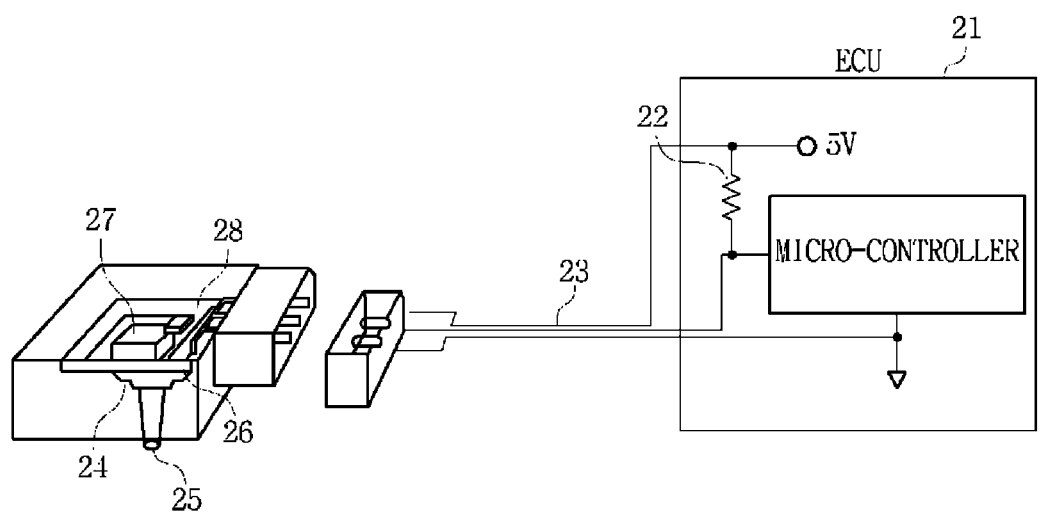
FIG. 2 is a diagram of a conventional signal processing method of a vehicle pressure sensor.
Figure 3A:
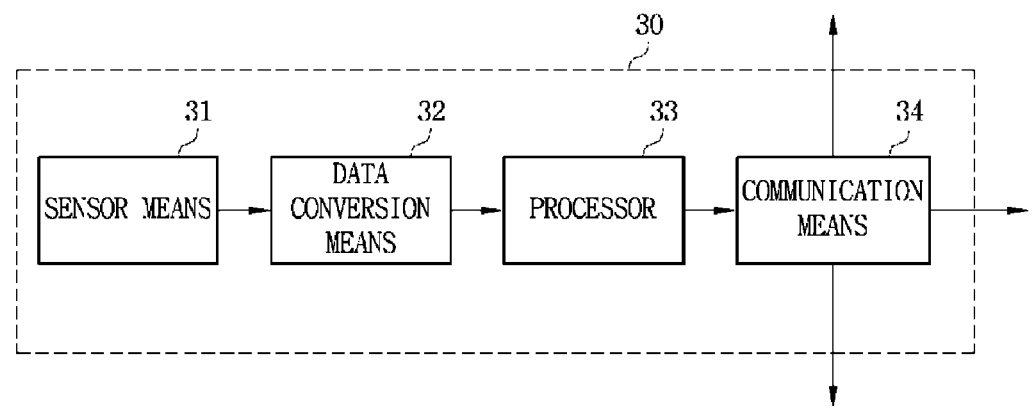
FIG. 3A is a block diagram of a conventional integrated sensor system for vehicles.
Figure 3B:
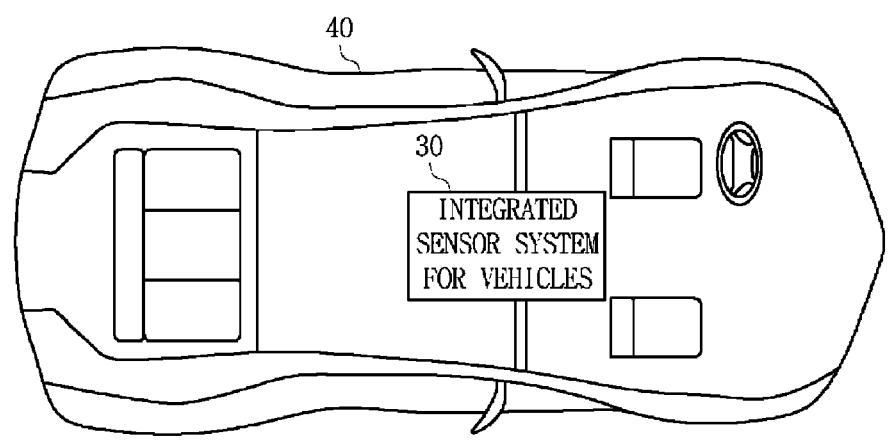
FIG. 3B is a diagram of a location of the integrated vehicle sensor system inside the vehicle.
Figure 4:
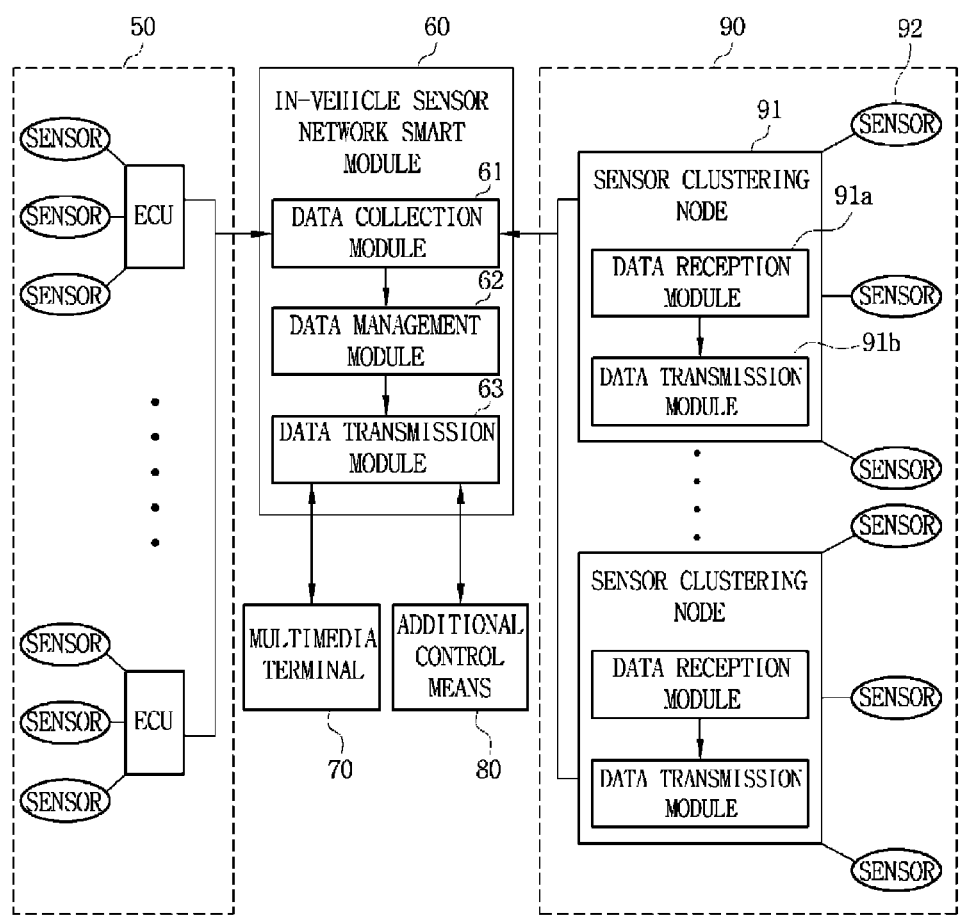
FIG. 4 is a block diagram of a conventional vehicle sensor network smart module.

Reference will now be made in detail to the embodiment of the present general inventive concept, examples of which are illustrated in the accompanying drawings, wherein like reference numerals refer to the like elements throughout. The embodiment is described below in order to explain the present general inventive concept by referring to the drawings.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases. The terms "unit" and "part" indicate a unit for processing at least one function or operation, and can be implemented with hardware or software or in combination.

Exemplary embodiments of the present invention provide an apparatus and a method for processing sensor data for a vehicle using an eXtensible Markup Language (XML) by aggregating and managing the vehicle sensor data in an XML format. Thus, even when the number of sensors increases, the format of the XML data is not changed. External devices such as telematics terminals can easily utilize the XML data.

Exemplary embodiments of the present invention provide a method for processing data of a sensor installed in a vehicle supporting vehicle communication protocol CAN or MOST, define the sensor data format as the XML, and employ an embedded system technique as an apparatus for processing the vehicle sensor data defined in the XML format.

Herein, the XML is a language drastically enhanced from HTML for creating Internet web pages and suggested by World Wide Web Consortium (W3C) in 1996. The XML improves the search function over the HTML and facilitates the complicated data processing and management of a client system. Besides, while the HTML cannot support the structured data such as database in the web page, the XML allows a user to manipulate the structured database as he/she wants. Syntactically, XML documents conform to a Standard Generalized Markup Language (SGML) document format.

Figure 5:
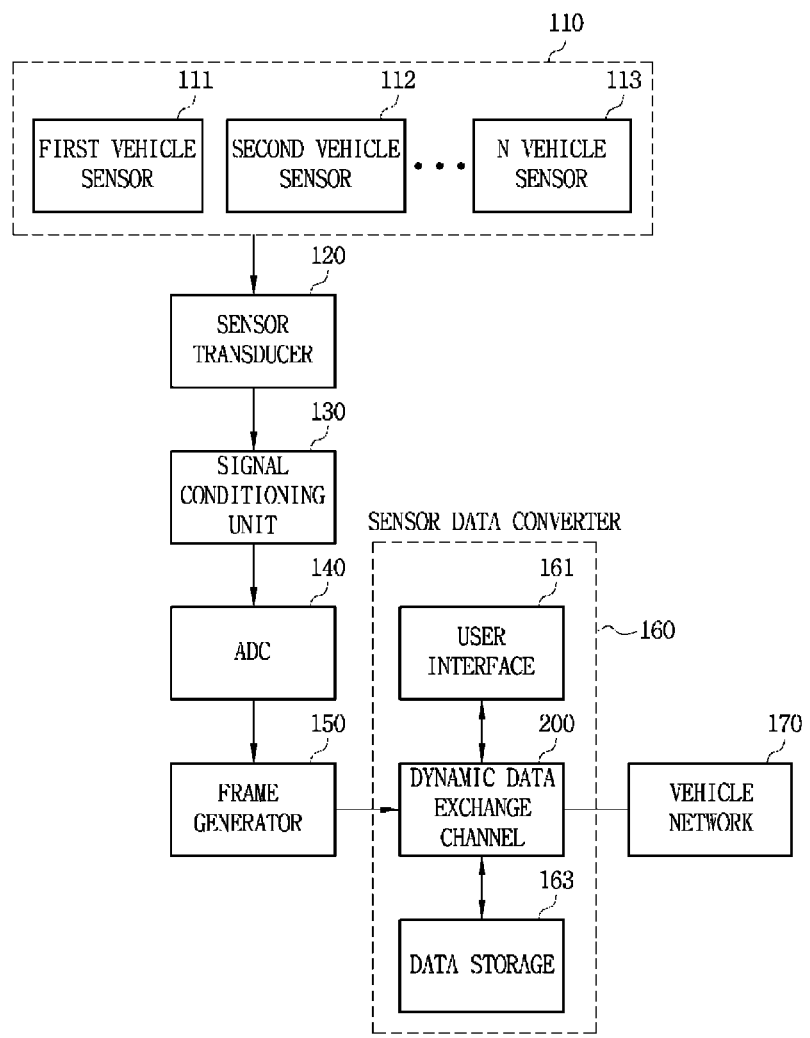
FIG. 5 is a simplified block diagram of a vehicle sensor data processing apparatus using XML according to an exemplary embodiment of the present invention.

FIG. 5 is a simplified block diagram of a vehicle sensor data processing apparatus using the XML according to an exemplary embodiment of the present invention.

Referring to FIG. 5, the vehicle sensor data processing apparatus using the XML according to an exemplary embodiment of the present invention includes a vehicle sensor 110, a sensor transducer 120, a signal conditioning unit 130, an Analog/Digital Converter (ADC) 140, a frame generator 150, and a sensor data converter 160. The vehicle sensor data processing apparatus is connected to a vehicle network 170.

The vehicle sensor 110 includes first through N vehicle sensors 111 through 113, and is installed inside the vehicle to detect a change of the physical quantity and to provide a detection signal. For example, the vehicle sensors 110 can include sensors for safety and convenience such as pressure sensor, collision detection sensor, temperature sensor, humidity sensor, wheel brake torque sensor, battery temperature sensor, battery voltage sensor, air discharge temperature sensor, brake pedal braking torque sensor, brake position sensor, front short-distance, middle-distance or long-distance sensor, and vehicle detection sensor.

The sensor transducer 120 converts the detection signal of the vehicle sensor to an electrical analog signal.

The signal conditioning unit 130 amplifies the electrical analog signal to a measurable signal. For example, the signal conditioning unit 130 can be an amplifier.

The ADC 140 converts the amplified analog signal to sensor data of a digital signal.

The frame generator 150 generates the sensor data converted to the digital signal per frame.

More specifically, the various vehicle sensors 110 analyze the signal state through the sensor transducer 120, digitize the signal through the ADC 140, and send the digital signal to the sensor data converter 160 including a 32-bit CPU, via the frame generator 150.

The sensor data converter 160 includes a user interface 161, a Dynamic data Exchange Channel (DEC) 200, and a data storage 163. The DEC 200 functions to process the sensor data in the XML format. The sensor data converter 160 batch-processes the sensor data input from the frame generator 150 per frame, in the XML format. That is, the sensor data converter 160 uses the XML to efficiently batch-process the great number of the vehicle sensor data in the vehicle supporting various communication protocols. In so doing, by defining a data structure using XML schema, the DEC 200 of the sensor data converter 160 modifies only schema data corresponding to the addition/deletion/modification of the data format. The sensor data converter 160 includes the 32-bit CPU for processing the vehicle sensor data, and can acquire, analyze, and process the sensor data.

By using the received vehicle sensor data in the unified format XML, the vehicle sensor data processing apparatus using the XML according to an exemplary embodiment of the present invention generates and processes a dynamic XML document which transforms the physical analog signal fed from the vehicle sensors to the data format usable in an application system such as telematics terminal.

In the vehicle sensor data processing apparatus using the XML according to an exemplary embodiment of the present invention, a sensor data processing mechanism using the XML provides a data exchange method between the vehicle sensors and a vehicle application system (for example, a navigation system and an in-vehicle terminal) using in-vehicle network communication, and thus realizes more efficient exchange of the various vehicle sensor data.

Figure 6:
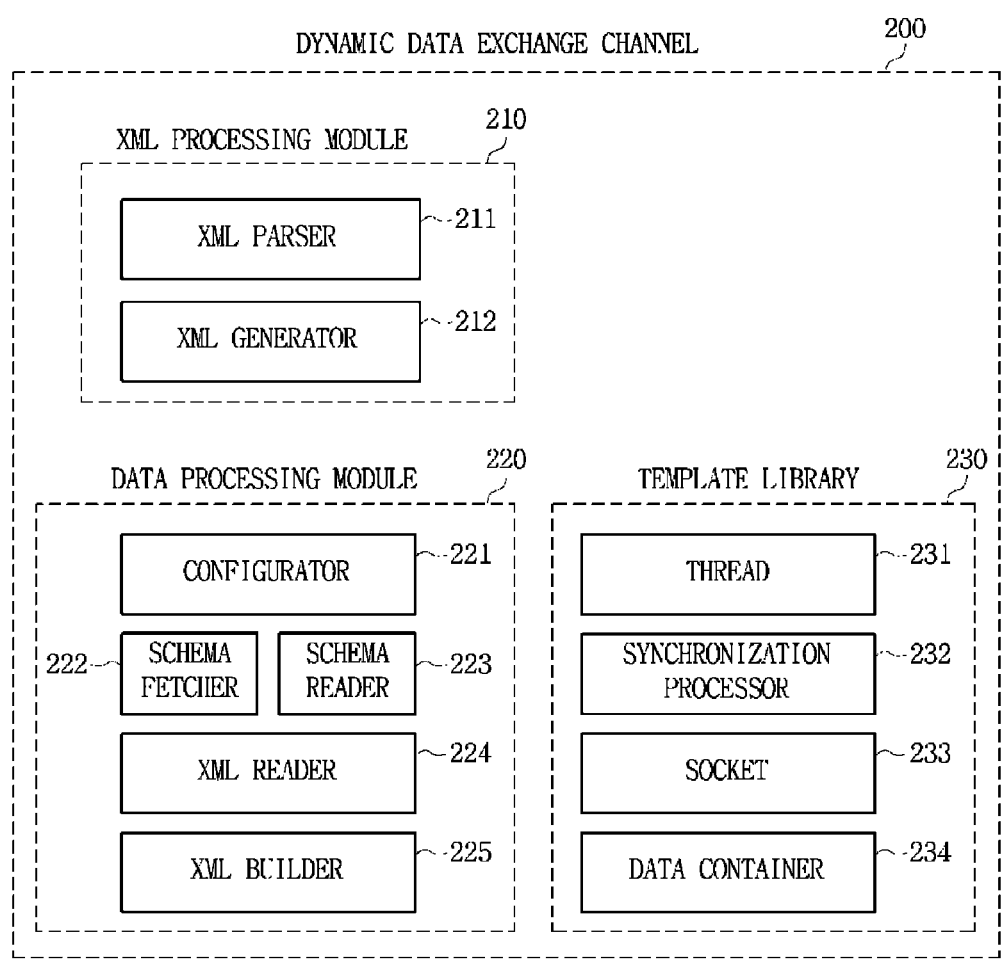
FIG. 6 is a detailed block diagram of a Dynamic data Exchange Channel (DEC) in the vehicle sensor data processing apparatus using the XML according to an exemplary embodiment of the present invention.

FIG. 6 is a detailed block diagram of the DEC in the vehicle sensor data processing apparatus using the XML according to an exemplary embodiment of the present invention.

In the vehicle sensor data processing apparatus using the XML according to an exemplary embodiment of the present invention, the DEC 200 of FIG. 6 includes three modules; an XML processing module 210, a data processing module 220, and a template library 230.

The XML processing module 210 includes an XML parser 211 and an XML generator 212. The data processing module 220 includes a configurator 221, a schema fetcher 222, a schema reader 223, an XML reader 224, and an XML builder 225. The template library 230 includes a thread 231, a synchronization processor 232, a socket 233, and a data container 234.

The XML processing module 210 functions to analyze and build the basic XML. The XML parser 211 of the XML processing module 210 analyzes the XML, and the XML generator 212 of the XML processing module 210 builds the XML.

The data processing module 220 assembles data in the XML format or analyzes the XML data and verifies the format according to the schema.

The template library 230 provides useful functions for transmitting, processing, and storing the sensor data.

In more detail, the configurator 221 of the data processing module 220 sets the location and the type of the sensor and the schema. The schema fetcher 222 of the data processing module 220 analyzes a schema file defined by a configuration file config.xml and fulfills corresponding contents. The schema reader 223 of the data processing module 220 provides the XML data format to the XML builder 225 of the data processing module 220 by aggregating schemas and defining the data format. The XML reader 224 of the data processing module 220 analyzes and constitutes the existing XML data in a tree structure, and modifies, searches, and extracts the intended information if necessary. Thus, the XML builder 225 of the data processing module 220 generates the collected sensor data in the XML data format according to the defined schema format.

The thread 231 of the template library 230, which is multithread, collects several sensor data at the same time.

The synchronization processor 232 of the template library 230 regulates or synchronizes behaviors in multiple processes which competitively utilize resources of an operating system. For example, the synchronization processor 232 can be implemented using semaphores or Mutex. Herein, the Mutex is the abbreviation of MUTal EXclusion. The Mutex is the technique for individually executing the threads by avoiding the simultaneous running time of the threads 231 having critical sections which can cause a problem when they are concurrently executed in a program. When a certain thread 231 is executing the critical section, other threads cannot access the critical section and need to wait until the former thread exits the critical section. The semaphores regulate or synchronize behaviors in the multiple processes competitively using resources of the operating system. In general, the semaphores are used for two purposes; that is, to share a memory space and to share and access files.

The socket 233 of the template library 230 establishes a communication channel required for the data collection.

The data container 234 of the template library 230 contains data.

In other words, the data processing module 220 is the most crucial part of the DEC 200. For example, the data processing module 220 reads the configuration file config.xml as shown in Table 1 and recognizes the type and the ID of the sensor to use in the system, and the schema file defining the format of the corresponding sensor data.

Next, data is collected from the sensors. To receive the sensor data from the plurality of the sensors, the template library 230 establishes the communication channel, for example, the socket and provides the multithread function.

The XML builder 225 of the data processing module 220 generates the collected sensor data in the XML data format according to the defined schema. The schema fetcher 222 of the data processing module 220 analyzes the schema file defined by the configuration file config.xml and fulfills its contents, and provides the necessary schema information when the XML builder 225 generates the XML data.

Figure 7:
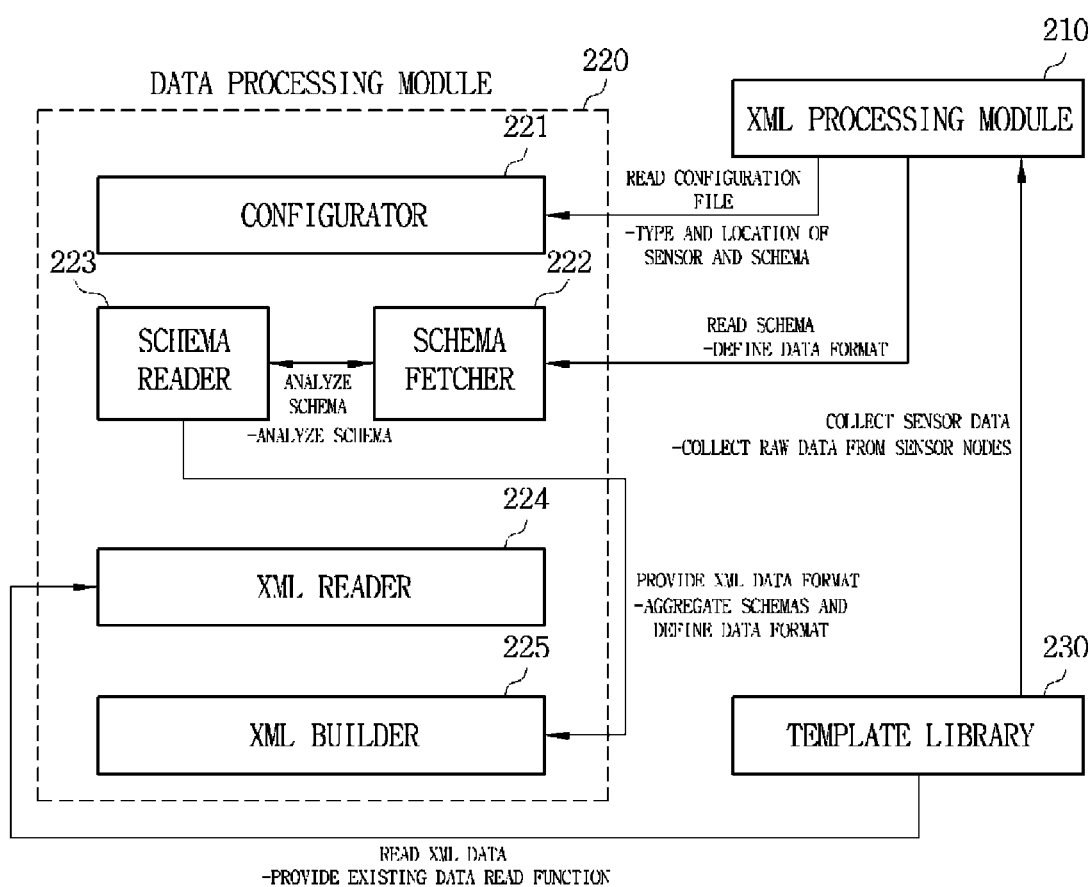
FIG. 7 is a detailed diagram of operations of a data processing module in the DEC of FIG. 6.

FIG. 7 is a detailed diagram of the operations of the data processing module in the DEC of FIG. 6.

The data processing module in the DEC includes the XML processing module 210, the data processing module 220, and the template library 230 as shown in FIG. 7. First, the template library 230 collects the sensor data; that is, unprocessed raw data via a plurality of sensor nodes.

Next, the XML processing module 210 acquires the type and the location of the sensor and the schema by reading the configuration file (for example, config.xml), and the XML processing module 210 reads the schema defining the data format.

The schema fetcher 222 of the data processing module 220 acquires the schema structure by analyzing the schema. The schema reader 223 of the data processing module 220 aggregates schemas, defines the data format, and provides the XML data format to the XML builder 225 of the data processing module 220.

Next, the XML builder 225 of the data processing module 220 generates the XML corresponding to the sensor data in the XML data format (S166).

In the vehicle sensor data processing method using the XML according to an exemplary embodiment of the present invention, the template library 230 may provide the XML data to the XML reader 224 of the data processing module 220 so as to read the existing XML data.

According to an exemplary embodiment of the present invention, the DEC 200 not only generates the sensor data in the XML data format but also analyzes the XML data pre-generated. The XML reader 223 of the data processing module 220 can analyze and constitute the existing XML data in the tree structure, and modify, search, and extract the intended information if necessary. Hence, an in-vehicle sensor data collecting system can use the DEC to generate the XML-format data, and a telematics terminal can use the DEC to analyze the XML data.

While the current vehicles mainly employ the CAN communication based sensor hardware technology, software modules and hardware similar to the present vehicle sensor data processing apparatus using the XML can be developed in future through the standardization and the application of the new automotive networks such as MOST and FlexRay.

Figure 8:
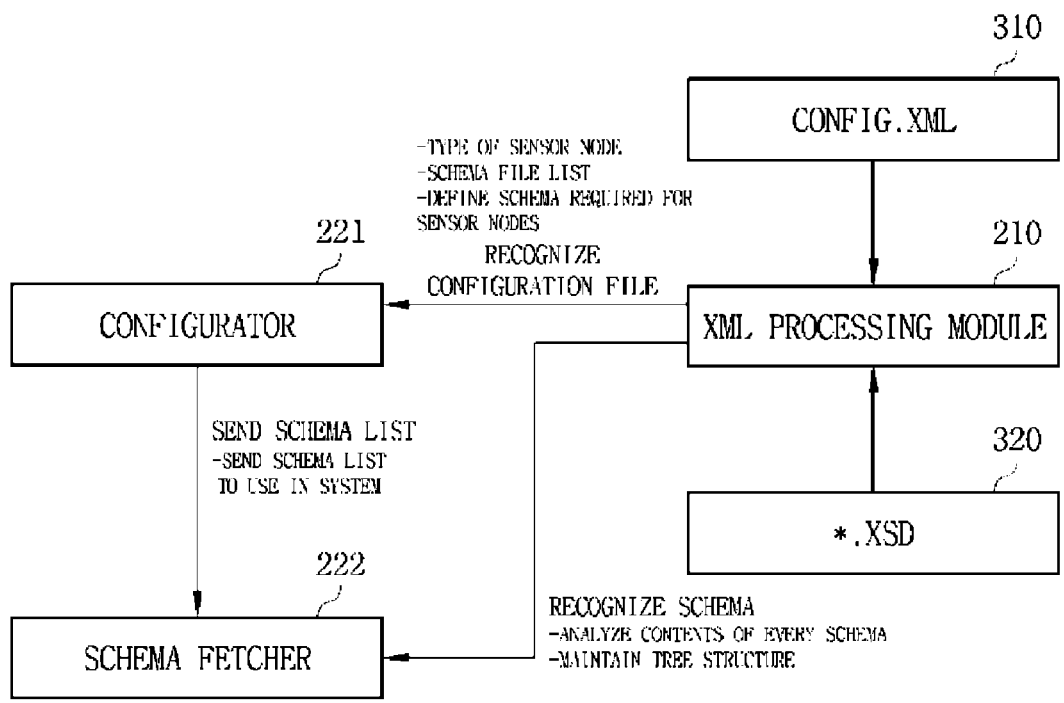
FIG. 8 is a detailed diagram of operations of an XML processing module in the DEC of FIG. 6.

FIG. 8 is a detailed diagram of the operations of the XML processing module in the DEC of FIG. 6.

The XML processing module 210 of the DEC recognizes the configuration file 310 (for example, config.xml) as shown in Table 1 and defines the type of the sensor node, a schema file list, and the schema required for each sensor node. Next, the configurator 221 of the data processing module 220 in the DEC sends the schema list to apply to the system to the schema fetcher 222.

The XML processing module 210 can provide an Application Programming Interface (API) required to analyze and to generate the XML by providing the XML processing function based on Document Object Model (DOM).

The XML processing module 210 analyzes contents of every schema by reading *.xsd file 320, for example, temperature.xsd in Table 2 or speed.xsd in Table 3 and recognizing the schema, and sends the analysis result to the schema fetcher 222 to maintain the tree structure.

TABLE 2

```
<!-- temperature.xsd -->
<xsd:schema xmlns:xsd="http://www.w3.org/2001/XMLSchema">
    <xsd:annotation>
        <xsd:documentation>
            The 'temperature' schema formulates the data given from a
            thermometer.
            Copyright(c) 2009, Korea Electronics Technology Institute.
        </xsd:documentation>
    </xsd:annotation>
    <xsd:element name="temperature" type="temperatureType"/>
    <xsd:complexType name="temperatureType">
        <xsd:sequence>
            <xsd:element name="description" type="xsd:string"/>
            <xsd:element name="value" type="xsd:short"/>
            <xsd:element name = "class"
            type="temperatureClassType"/>
        </xsd:sequence>
    </xsd:complexType>
    <xsd:simpleType name="temperatureClassType">
        <xsd:restriction base="xsd:string">
            <xsd:enumeration value="fahrenheit"/>
            <xsd:enumeration value="celsius"/>
        </xsd:restriction>
    </xsd:simpleType>
</xsd:schema>
```

TABLE 3

```
<!-- speed.xsd -->
<xsd:schema xmlns:xsd="http://www.w3.org/2001/XMLSchema">
    <xsd:annotation>
        <xsd:documentation>
            The 'speed' schema formulates the data given from a
            speedometer..
            Copyright(c) 2009, Korea Electronics Technology Institute.
        </xsd:documentation>
    </xsd:annotation>
    <xsd:element name="speed" type="speedType"/>
    <xsd:complexType name="speedType">
        <xsd:sequence>
            <xsd:element name="description" type="xsd:string"/>
            <xsd:element name="value" type="xsd:short"/>
            <xsd:element name="class" type="speedClassType"/>
        </xsd:sequence>
```

TABLE 1

```
<!-- config.xml -->
<?xml version="1.0" encoding="euc-kr" ?>
<decConfig version="0.0.1">
    <documentation>
        Dynamic data Exchange Channel(DEC) configuration data
        Copyright(c) 2009, Korea Electronics Technology Institute.
    </documentation>
    <schemaElement location="local" type="file" name="temperature" source="temperature.xsd"/>
    <schemaElement location ="local" type="file" name="rpm" source="rpm.xsd"/>
    <device type="thermometer" name="thermometer_1" schema="temperature" address="10.0.1.101">
        Outdoor temperature
    </device>
    <device type="thermometer" name="thermometer_2" schema="temperature" address="10.0.1.102">
        Indoor temperature
    </device>
    <device type="revolutaion-indicator" name="indicator_1" schema="rpm" address="10.0.1.105">
        Number of revolutions of the engine
    </device>
</decConfig>
```

TABLE 3-continued

```
        </xsd:complexType>
        <xsd:simpleType name="speedClassType">
            <xsd:restriction base="xsd:string">
                <xsd:enumeration value="km/h">
                    kilometers per hour
                </xsd:enumeration>
                <xsd:enumeration value="mph">
                    miles per hour
                </xsd:enumeration>
                <xsd:enumeration value="knots">
                    knots
                </xsd:enumeration>
            </xsd:restriction>
        </xsd:simpleType>
</xsd:schema>
```

Figure 9:
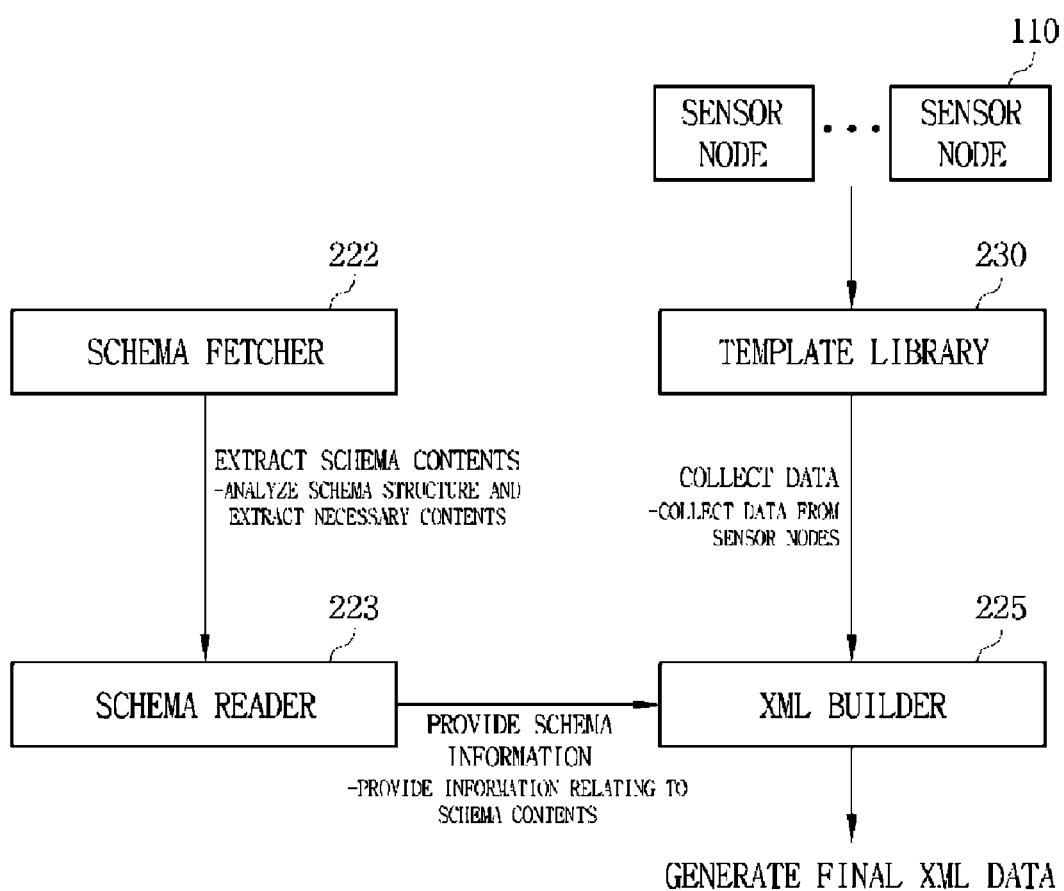
FIG. 9 is a detailed diagram of operations of a template library in the DEC of FIG. 6.

FIG. 9 is a detailed diagram of the operations of the template library in the DEC of FIG. 6.

The template library 230 of the DEC collects the sensor data from the sensor nodes 110 and sends the collected sensor data to the XML builder 225 of the data processing module 220 as shown in FIG. 9. The schema fetcher 222 of the data processing module 220 analyzes the schema, extracts necessary contents, and sends them to the schema reader 223. The schema reader 223 provides the information relating to the schema contents to the XML builder 225.

Hence, the XML builder 225 generates final XML data, for example, dec.xml as shown in Table 4.

TABLE 4

```
<!-- dec.xml -->
<xsd:schema xmlns:xsd="http://www.w3.org/2001/XMLSchema">
    <xsd:annotation>
        <xsd:documentation>
            Dynamic data Exchange Channel
            Copyright(c) 2009, Korea Electronics Technology Institute.
        </xsd:documentation>
    </xsd:annotation>
    <xsd:element name="dec" type="decDataType"/>
    <temperature>
        <description>Outdoor temperature</description>
        <value>11</value>
        <class>celsius</class>
    </temperature>
    <temperature>
        <description>Indoor temperature</description>
        <value>17</value>
        <class>celsius</class>
    </temperature>
    <speed>
        <description>Current speed</description>
        <value>80</value>
        <class>km/h</class>
    </speed>
</xsd:schema>
```

The vehicle sensor data processing apparatus using the XML according to an exemplary embodiment of the present invention can be applied to process data of an intelligent smart sensor installed in future intelligent vehicles. The sensor data processing method converts the analog sensor data to the digital data, stores the data in the XML format according to the data conversion algorithm, and provides the hardware device and the software algorithm to send the information to the in-vehicle embedded system over the in-vehicle network. The vehicle sensor data processing apparatus using the XML according to an exemplary embodiment of the present invention can employ the embedded system including the 32-bit CPU as the data processing device for processing the plurality of the vehicle sensor data.

FIG. 10 is a flowchart of the vehicle sensor data processing method using the XML according to an exemplary embodiment of the present invention, and FIG. 11 is a detailed flowchart of the DEC in the vehicle sensor data processing method using the XML according to an exemplary embodiment of the present invention.

In the vehicle sensor data processing method using the XML according to an exemplary embodiment of the present invention of FIG. 10, the plurality of the vehicle sensors installed inside the vehicle detects the signal according to the change of the physical quantity (S110).

The sensor transducer converts the signal to the electrical analog signal in order to analyze the state of the signals detected by the vehicle sensors (S120).

The signal conditioning unit amplifies the electrical analog signal to the measurable signal (S130).

The ADC converts the amplified analog signal to the sensor data of the digital signal (S140).

The frame generator generates the frames of the digital sensor data and provides, for example, the 32-bit digital signal per frame (S150).

The DEC of the sensor data converter transforms the sensor data which is the 32-bit digital signal provided per frame, to the XML-format data (S160). The transformation of the sensor data being the 32-bit digital signal to the XML-format data shall be elucidated by referring to FIG. 11.

Next, the XML builder of the DEC stores or outputs the converted XML-format sensor data (S170).

Referring now to FIG. 11, in the DEC 200 including the XML processing module 210, the data processing module 220, and the template library 230, the template library 230 collects the sensor data (S161). That is, the unprocessed raw data is collected via the plurality of the sensor nodes.

The XML processing module 210 acquires the type and the location of the sensor and the schema by reading the configuration file (for example, config.xml) (S162), and then reads the schema defining the data format (S163).

The schema fetcher 222 of the data processing module 220 acquires the schema by analyzing the schema (S164). The schema reader 223 of the data processing module 220 aggregates the schemas, defines the data format, and provides the XML data format to the XML builder 225 of the data processing module 220 (S165).

Next, the XML builder 225 of the data processing module 220 generates the XML data corresponding to the sensor data according to the XML data format (S166). The generated XML data can be output or stored as shown in Table 4.

In the vehicle sensor data processing method using the XML according to an exemplary embodiment of the present invention, the template library 230 may provide the XML data to the XML reader 224 of the data processing module 220 so as to read the existing XML data.

The present invention can be applied to the hardware system including the 32-bit CPU such as in-vehicle application system (for example, navigation system and in-vehicle terminal) and typical embedded system. While the present invention is designed and developed for the application systems for the vehicle, one skilled in the art shall understand that the sensor data processing software module based on the XML can be used in other embedded application systems.

As set forth above, various data is exchanged in the process of the communication between diverse vehicle sensors and the vehicle application system. In so doing, using the unified data format XML, rather than exchanging the data in different formats and manners, it is possible to facilitate the processing of the transmit and receive data in terms of the vehicle network of the sensor and the application system and to easily handle the data structure in terms of the vehicle sensor developer and the terminal system developer.

By defining the data structure by means of the schema which is one of the features of the XML, only the schema data can be modified when the data format is added/deleted/modified without having to modify the program code. Therefore, the data format between the vehicle sensor and the vehicle application system can be changed with ease.

Since the transmitted and received data structure can be verified using the schema, reliable interworking relation can be established between the vehicle sensor and the vehicle application system.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for processing sensor data for a vehicle using an eXtensible Markup Language (XML), comprising:
   a plurality of vehicle sensors installed inside the vehicle for detecting a change of physical quantity and providing a detection signal;
   a sensor transducer for converting the detection signal of the vehicle sensors to an electrical analog signal;
   a signal conditioning unit for amplifying the electrical analog signal to a measurable signal;
   an Analog/Digital Converter (ADC) for converting the amplified analog signal to sensor data of a digital signal;
   a frame generator for generating and providing the sensor data converted to the digital signal per frame; and
   a sensor data converter comprising a Dynamic data Exchange Channel (DEC) for batch-processing the sensor data input from the frame generator per frame, in an XML format,
   wherein the DEC of the sensor data converter defines a structure of the sensor data using a schema of the XML and converts the sensor data format to the XML format at the same time.

2. The apparatus of claim 1, wherein the DEC comprises:
   an XML processing module for analyzing and generating basic XML;
   a data processing module for assembling the sensor data in the XML format or analyzing the XML data, and verifying a format according to the schema; and
   a template library for providing various useful functions required to transmit, process, and store the sensor data.

3. The apparatus of claim 2, wherein the data processing module comprises:
   a configurator for configuring location and type of the sensor and the schema;
   a schema fetcher for analyzing a schema file defined by a configuration file and having corresponding contents;
   a schema reader for aggregating schemas, defining a data format, and providing the XML data format; and
   an XML builder for receiving the XML data format from the schema reader and generating the aggregated sensor data in the XML data format according to the defined schema.

4. The apparatus of claim 3, wherein the data processing module further comprises:
   an XML reader for analyzing and constituting existing XML data in a tree structure, and modifying, searching, and extracting intended information if necessary.

5. The apparatus of claim 2, wherein the XML processing module provides an Application Programming Interface (API) required to analyze and to generate the XML by providing an XML processing function based on Document Object Model (DOM).

6. The apparatus of claim 2, wherein the template library comprises:
   a thread for providing a multithread function to collect a plurality of sensor data at the same time;
   a synchronization processor for synchronizing the sensor data;
   a socket for establishing a communication channel required to collect the sensor data; and
   a data container for containing the collected data.

7. The apparatus of claim 1, wherein the sensor data converter comprises a 32-bit CPU for processing 32-bit sensor data provided from the frame generator.

8. A method for processing sensor data for a vehicle using an eXtensible Markup Language (XML), comprising:
   a) detecting, at a plurality of vehicle sensors installed inside the vehicle, a signal according to a change of physical quantity;
   b) converting the signal to an electrical analog signal to analyze state of the signal detected by the vehicle sensors;
   c) amplifying the electrical analog signal to a measurable signal;
   d) converting the amplified analog signal to sensor data of a digital signal;
   e) generating frames of the sensor data of the digital signal and providing the sensor data per frame; and
   f) converting, at a Dynamic data Exchange Channel (DEC), the sensor data provided per frame, to an XML-format data,
   wherein the DEC defines a structure of the sensor data using a schema of the XML and converts the sensor data format to the XML format at the same time.

9. The method of claim 8, further comprising:
   storing or outputting the converted XML-format sensor data.

10. The method of claim 8, wherein the DEC of the step f) comprises an XML processing module, a data processing module, and a template library, and
    the step f) comprises:
    f-1) collecting the sensor data through the template library;
    f-2) acquiring, at the XML processing module, type and location of the sensors and the schema by reading a configuration file;
    f-3) reading, at the XML processing module, the schema defining the data format;
    f-4) acquiring, at a schema fetcher of the data processing module, the schema structure by analyzing the schema;
    f-5) aggregating, at a schema reader of the data processing module, schemas, defining the data format, and providing the XML data format; and
    f-6) generating, at an XML builder of the data processing module, XML data corresponding to the sensor data according to the XML data format.

11. The method of claim 10, further comprising:
    analyzing and constituting existing XML data in a tree structure, and modifying, searching, and extracting intended information if necessary.

* * * * *